(12) United States Patent
Ma et al.

(10) Patent No.: US 9,786,643 B2
(45) Date of Patent: Oct. 10, 2017

(54) SEMICONDUCTOR DEVICES COMPRISING PROTECTED SIDE SURFACES AND RELATED METHODS

(71) Applicant: Micron Technology, Inc., Boise, ID (US)

(72) Inventors: Zhaohui Ma, Singapore (SG); Wei Zhou, Singapore (SG); Chee Chung So, Singapore (SG); Soo Loo Ang, Singapore (SG); Aibin Yu, Singapore (SG)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/325,619

(22) Filed: Jul. 8, 2014

(65) Prior Publication Data

US 2016/0013154 A1   Jan. 14, 2016

(51) Int. Cl.
| | |
|---|---|
| H01L 25/065 | (2006.01) |
| H01L 25/18 | (2006.01) |
| H01L 25/00 | (2006.01) |
| H01L 21/56 | (2006.01) |
| H01L 23/00 | (2006.01) |

(Continued)

(52) U.S. Cl.
CPC ............ *H01L 25/18* (2013.01); *H01L 21/561* (2013.01); *H01L 21/563* (2013.01); *H01L 21/6835* (2013.01); *H01L 21/78* (2013.01); *H01L 23/3107* (2013.01); *H01L 23/3128* (2013.01); *H01L 23/544* (2013.01); *H01L 24/94* (2013.01); *H01L 24/96* (2013.01); *H01L 25/0657* (2013.01); *H01L 25/50* (2013.01); *H01L 2221/68359* (2013.01); *H01L 2221/68381* (2013.01); *H01L 2223/54433* (2013.01); *H01L 2223/54486* (2013.01); *H01L 2224/16145* (2013.01); *H01L 2224/32145* (2013.01); *H01L 2224/73204* (2013.01); *H01L 2224/94* (2013.01); *H01L 2224/97* (2013.01); *H01L 2225/06513* (2013.01); *H01L 2225/06541* (2013.01); *H01L 2924/1431* (2013.01); *H01L 2924/1434* (2013.01); *H01L 2924/18161* (2013.01)

(58) Field of Classification Search
CPC .... H01L 25/0657; H01L 21/561; H01L 21/78
See application file for complete search history.

(56) References Cited

U.S. PATENT DOCUMENTS

| | | |
|---|---|---|
| 7,144,800 B2 | 12/2006 | Mostafazadeh et al. |
| 7,910,385 B2 | 3/2011 | Kweon et al. |

(Continued)

*Primary Examiner* — Michael Carter
(74) *Attorney, Agent, or Firm* — TraskBritt

(57) ABSTRACT

Methods of protecting semiconductor devices may involve forming trenches in streets between stacks of semiconductor dice on regions of a semiconductor wafer. A protective material may be positioned between the die stacks and in the trenches, after which the wafer is thinned from a side opposite the die stacks to expose the protective material in the trenches. Semiconductor devices comprising stacks of dice and corresponding base semiconductor dice comprising wafer regions are separated from one another by cutting through the protective material along the streets and in the trenches. The protective material covers at least sides of each die stack as well as side surfaces of the corresponding base semiconductor die.

11 Claims, 9 Drawing Sheets

(51) Int. Cl.
    *H01L 23/31*    (2006.01)
    *H01L 23/544*   (2006.01)
    *H01L 21/683*   (2006.01)
    *H01L 21/78*    (2006.01)

(56) References Cited

U.S. PATENT DOCUMENTS

| | | | |
|---|---|---|---|
| 8,357,564 B2 | 1/2013 | Chi et al. | |
| 8,552,567 B2 | 10/2013 | England et al. | |
| 8,937,309 B2 | 1/2015 | England et al. | |
| 2002/0048889 A1* | 4/2002 | Hayama | H01L 21/568 438/304 |
| 2004/0036167 A1* | 2/2004 | Sugiyama | H01L 21/78 257/728 |
| 2006/0276009 A1* | 12/2006 | Kurogi | H01L 21/78 438/460 |
| 2008/0315372 A1* | 12/2008 | Kuan | H01L 21/568 257/659 |
| 2008/0315375 A1 | 12/2008 | Eichelberger et al. | |
| 2009/0243097 A1* | 10/2009 | Koroku | H01L 21/561 257/737 |
| 2011/0080384 A1 | 4/2011 | Liu et al. | |
| 2011/0186910 A1 | 8/2011 | Forrest et al. | |
| 2012/0038045 A1* | 2/2012 | Lee | H01L 23/3107 257/738 |
| 2012/0088332 A1* | 4/2012 | Lee | H01L 21/561 438/113 |
| 2013/0075895 A1* | 3/2013 | Miura | H01L 27/115 257/737 |
| 2013/0328177 A1 | 12/2013 | Cho et al. | |
| 2014/0054796 A1* | 2/2014 | Gong | H01L 23/3128 257/777 |
| 2014/0091473 A1 | 4/2014 | Len et al. | |
| 2014/0237307 A1 | 8/2014 | Kobla et al. | |
| 2015/0108424 A1 | 4/2015 | Huang et al. | |
| 2016/0013154 A1 | 1/2016 | Ma et al. | |
| 2016/0358898 A1 | 12/2016 | Zhou et al. | |

\* cited by examiner

SEMICONDUCTOR DEVICES COMPRISING PROTECTED SIDE SURFACES AND RELATED METHODS

CROSS-REFERENCE TO RELATED APPLICATION

The subject matter of this application is related to the subject matter of U.S. patent application Ser. No. 14/730,681, filed Jun. 4, 2015, for "METHODS OF MANUFACTURING MULTI-DIE SEMICONDUCTOR DEVICE PACKAGES AND RELATED ASSEMBLIES," the disclosure of which is incorporated herein in its entirety by this reference.

FIELD

This disclosure relates generally to semiconductor devices and methods of manufacturing and protecting semiconductor devices. More specifically, disclosed embodiments relate to semiconductor devices comprising stacked die assemblies having protected side surfaces and methods of protecting side surfaces of such semiconductor devices.

BACKGROUND

During manufacturing, an active surface of a semiconductor wafer and laterally separate stacks of semiconductor dice on die locations of the wafer may be encapsulated in a protective material. Individual semiconductor devices comprising the stacked semiconductor dice and a semiconductor die from the wafer may be formed by cutting through the protective material between the die stacks and through the semiconductor wafer along streets between the semiconductor devices to "singulate" the semiconductor devices. Cutting through the semiconductor wafer at the base of a die stack may, in some instances, introduce cracks into or otherwise damage the side surfaces of the resulting semiconductor dice cut from the wafer.

When the semiconductor devices have been separated from one another, side surfaces of each semiconductor die cut from the semiconductor wafer, which may be referred to herein as a "base" semiconductor die for the sake of clarity, may remain exposed during subsequent processing and handling. Specifically, while the die stacks are separated by streets filled with protective material, the base semiconductor dice each comprise wafer material extending under the streets and between adjacent die stacks. Therefore, while the singulation process leaves protective material on the sides of the die stacks, singulation of the wafer leaves wafer material on the sides of the base semiconductor dice exposed.

As a result, the side surfaces of the base semiconductor die may remain exposed as the semiconductor device is transferred to different locations in a facility for further processing of the semiconductor devices, during testing of the semiconductor devices, during assembly of the semiconductor device with higher level packaging and, in some instances, during shipping to and use by a customer. The exposed side surfaces of the base semiconductor die may be damaged during such subsequent processing, testing, assembly and handling, for example, by incidental impacts. In addition, moisture, such as environmental moisture (e.g., humidity) may infiltrate an interface between the protective material at the bottom of the die stack contacting the surface of the base semiconductor die obtained from the semiconductor wafer. The moisture may cause the protective material to detach from the base semiconductor die, such as, for example, through successive expansions and contractions of the protective material during temperature changes.

A semiconductor device produced from singulation of a semiconductor wafer and die stacks may subsequently be physically and electrically attached to an interposer, forming an assembly for connection to higher-level packaging. The die stack and base semiconductor dice may then in some instances be encapsulated by overmolding with the same or another protective material. The interposer undesirably adds to a final height of the assembly, as well as an extra process step and material required by the overmolding of protective material.

BRIEF DESCRIPTION OF THE DRAWINGS

While this disclosure concludes with claims particularly pointing out and distinctly claiming embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular act in a method, semiconductor wafer, semiconductor device, or component thereof, but are merely idealized representations employed to describe illustrative embodiments. Thus, the drawings are not necessarily to scale.

Disclosed embodiments relate generally to semiconductor devices comprising protected side surfaces and methods of protecting side surfaces of semiconductor devices. More specifically, disclosed are embodiments of methods of manufacturing semiconductor devices during which protective material is positioned on the side surfaces of semiconductor dice.

In embodiments of the disclosure, a method comprises forming trenches in streets between regions of a semiconductor wafer, each region bearing a corresponding stack of semiconductor dice, positioning a protective material between the stacks of semiconductor dice and in the trenches, and separating the regions of integrated circuitry and corresponding stacks of semiconductor dice through the protective material to form semiconductor devices having the protective material on sides of the semiconductor dice of the die stacks and side surfaces of base semiconductor dice from the semiconductor wafer.

Figure 1:
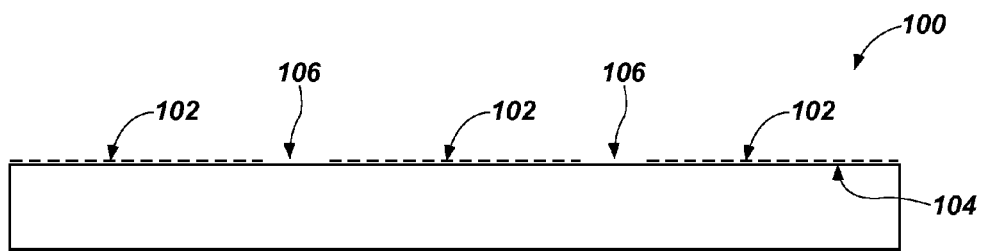
FIG. 1 is a cross-sectional view of a portion of a semiconductor wafer in a first state.

Referring to FIG. 1, a cross-sectional view of a portion of a semiconductor wafer 100 in a first state is shown. The semiconductor wafer 100 may include regions of integrated circuitry 102 at an active surface 104 of the semiconductor wafer 100. Streets 106 may be located between the regions of integrated circuitry 102 comprising die locations on the active surface 104 of the semiconductor wafer 100. The semiconductor wafer 100 may be, for example, substantially disc-shaped, and the regions of integrated circuitry 102 and intervening streets 106 may be arranged in, for example, a grid pattern on the active surface 104 of the semiconductor wafer 100.

Figure 2:
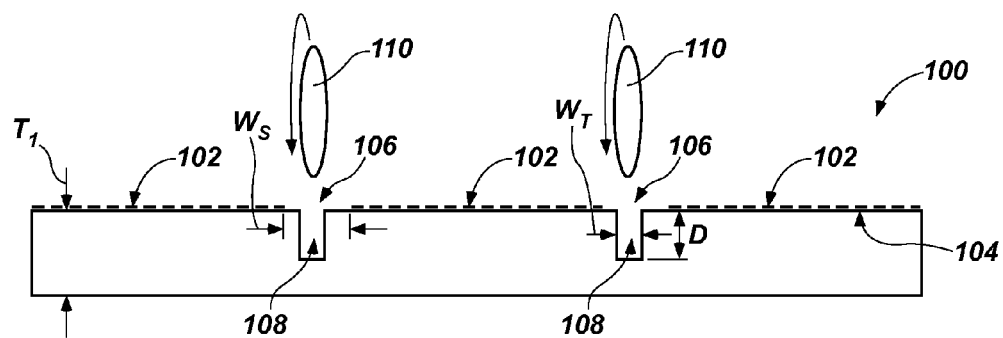
FIG. 2 is a cross-sectional view of the portion of the semiconductor wafer of FIG. 1 in a second state.

FIG. 2 is a cross-sectional view of the portion of the semiconductor wafer 100 of FIG. 1 in a second state. Trenches 108, which may also be characterized as "kerfs," may be faulted in and along the streets 106 between the regions of integrated circuitry 102. For example, a thickness $T_1$ of the semiconductor wafer 100 may be partially cut through to form the trenches 108. More specifically, one or more first blades 110 configured to cut through semiconductor material (e.g., diamond-impregnated saw blades) may be employed to partially cut through the semiconductor wafer 100 along the streets 106 to form the trenches 108. The trenches 108 may be, for example, at least substantially centered between the regions of integrated circuitry 102. The semiconductor wafer 100 may remain intact after the trenches 108 are formed, such that the regions of integrated circuitry 102 are not physically separated from one another. In other words, the semiconductor wafer 100 may remain a single structure of contiguous semiconductor material after the trenches 108 are formed.

A depth D of the trenches 108 may be greater than or equal to a predetermined final thickness $T_2$ (see FIG. 5) of the semiconductor wafer 100 from which die stack assemblies may be singulated. For example, the depth D of the trenches 108 may be greater than or equal to one-tenth of the initial thickness $T_1$ of the semiconductor wafer 100, which thickness $T_1$ may be, for example, on the order of about 700 microns to about 750 microns. More specifically, the depth D of the trenches 108 may be greater than or equal to one-third of the initial thickness $T_1$ of the semiconductor wafer 100. As a specific, nonlimiting example, the depth D of the trenches 108 may be greater than or equal to one-half of the initial thickness $T_1$ of the semiconductor wafer 100. The depth D of the trenches 108 may be greater than or equal to 40 microns. More specifically, the depth D of the trenches 108 may be greater than or equal to 175 microns. Further, the depth D of the trenches 108 may be greater than or equal to 235 microns. As a specific, nonlimiting example, the depth D of the trenches 108 may be greater than or equal to 350 microns.

A width $W_T$ of the trenches 108 may be less than a width $W_S$ of the streets 106. For example, the width $W_T$ of the trenches 108 may be between about one-tenth and nine-tenths of the width $W_S$ of the streets 106. More specifically, the width $W_T$ of the trenches 108 may be between about one-fourth and three-fourths of the width $W_S$ of the streets 106. As a specific, nonlimiting example, width $W_T$ of the trenches 108 may be between about one-fourth and one-half of the width $W_S$ of the streets 106. The width $W_T$ of the trenches 108 may be, for example, less than 400 microns. More specifically, the width $W_T$ of the trenches 108 may be, for example, between about 100 microns and about 200 microns. As a specific, nonlimiting example, the width $W_T$ of the trenches 108 may be between about 125 microns and about 175 microns.

Figure 3:
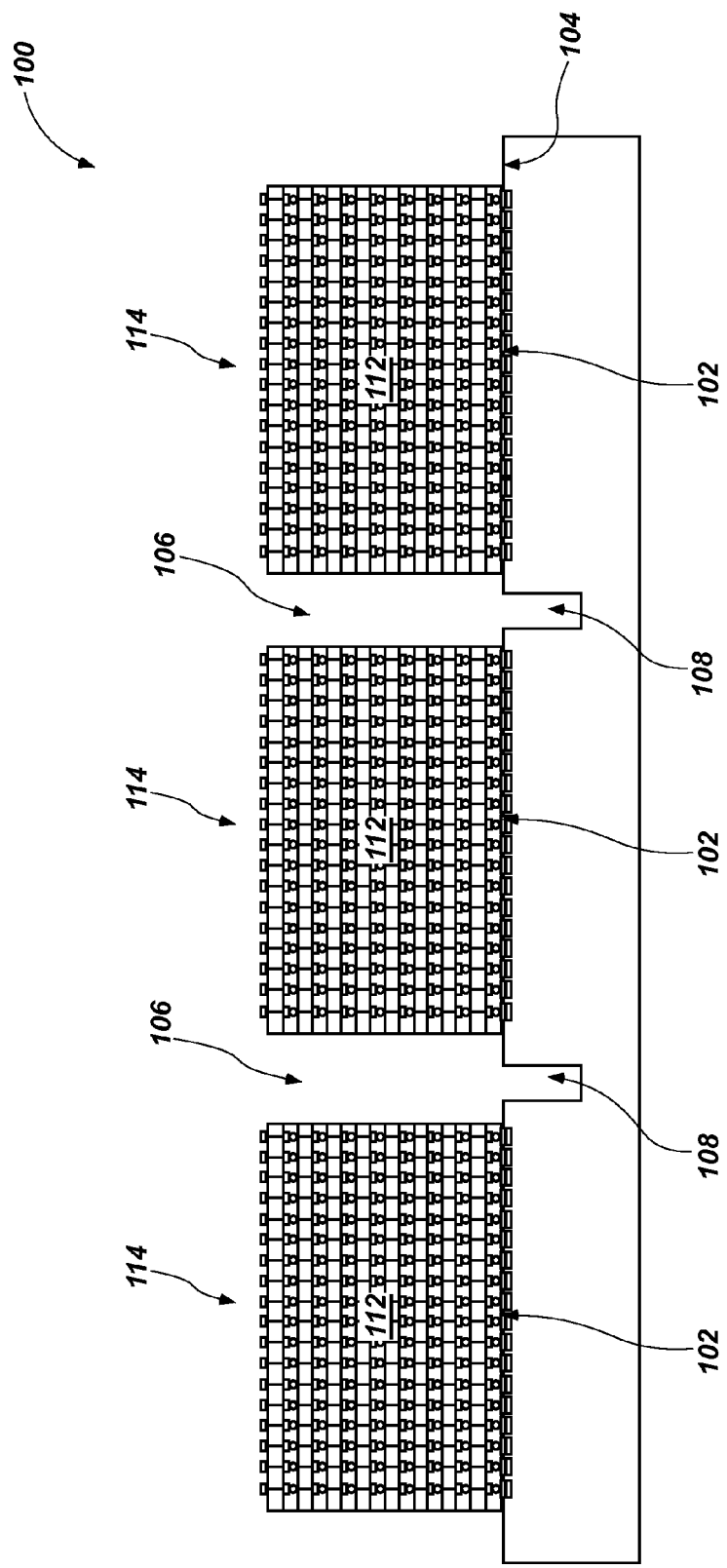
FIG. 3 is a cross-sectional view of the portion of the semiconductor wafer of FIG. 1 in a third state.

FIG. 3 is a cross-sectional view of the portion of the semiconductor wafer 100 of FIG. 1 in a third state. In some embodiments, such as that shown in FIG. 3, a stack of semiconductor dice 112 may be positioned over, electrically connected to, and physically secured to a region of integrated circuitry 102. For example, a stack of semiconductor dice 112 may be positioned over, electrically connected to, and physically secured to each of at least two adjacent, corresponding regions of integrated circuitry 102, forming separate semiconductor devices 114 between the streets 106. More specifically, a stack of semiconductor dice 112 may be positioned over, electrically connected to, and physically secured to each corresponding region of integrated circuitry 102 to form precursor structures of separate semiconductor devices 114 separated by streets 106. For example, and as is known to those of ordinary skill in the art, semiconductor dice 112 may be stacked, layer by layer, and electrically connected and physically secured to respective regions of integrated circuitry 102 using a thermocompression bonding process to bond conductive elements protruding from an active surface of a semiconductor die 112, or protruding from a region of integrated circuitry 102 on wafer 100, to conductive pads on a back side of an adjacent semiconductor die 112. Such bonding may be effected, for example, by reflowing a solder material, or by diffusion bonding. A dielectric underfill material is disposed between the semiconductor dice 112 of each stack and between the semiconductor die 112 adjacent wafer 100 and wafer 100. The dielectric underfill material may, for example, comprise a capillary underfill, a pre-applied non-conductive paste, a non-conductive film, a wafer-level underfill (WLUF), or a molded underfill.

A number of semiconductor dice in a respective stack of semiconductor dice 112 may be, for example, four or more. More specifically, the number of semiconductor dice in a respective stack of semiconductor dice 112 may be, for example, between four and sixteen. As specific, nonlimiting examples, the number of semiconductor dice in a respective stack of semiconductor dice 112 may be four, eight, twelve or sixteen.

A respective stack of semiconductor dice 112 and the corresponding region of integrated circuitry 102 may form a semiconductor device 114. As specific, nonlimiting examples, the semiconductor dice in the stack of semiconductor dice 112 may be memory dice and the corresponding region of integrated circuitry 102 may comprise memory circuitry, logic circuitry, or circuitry comprising a system on a chip (SoC).

Figure 4:
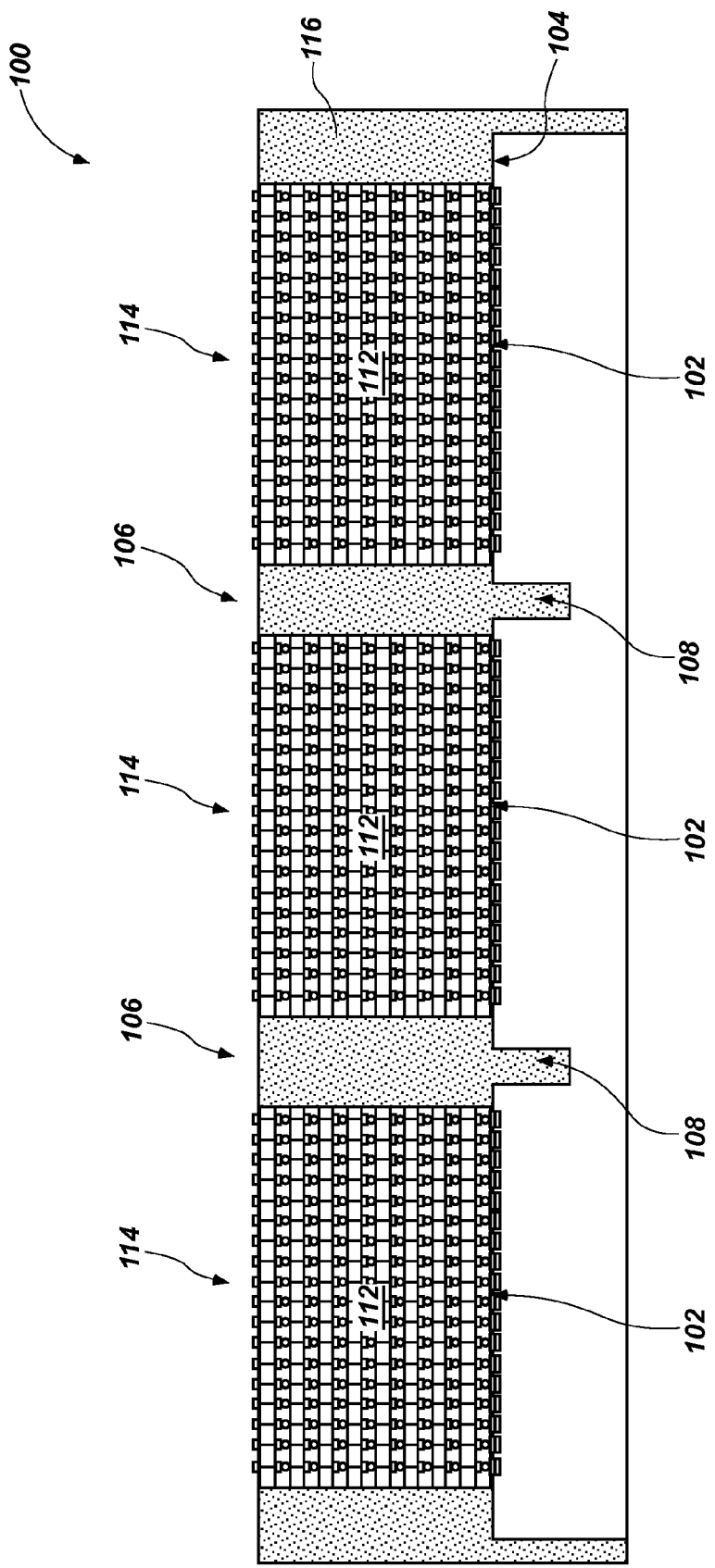
FIG. 4 is a cross-sectional view of the portion of the semiconductor wafer of FIG. 1 in a fourth state.

FIG. 4 is a cross-sectional view of the portion of the semiconductor wafer of FIG. 1 in a fourth state. Protective material 116 may be positioned along the streets 106 in the trenches 108 and between the stacks of semiconductor dice 112. For example, the protective material 116 may at least substantially fill the trenches 108. More specifically, the protective material 116 may be dispensed to at least substantially fill the trenches 108 and extend over at least a portion of the active surface 104 of the semiconductor wafer 100 between the stacks of semiconductor dice 112. As a specific, nonlimiting example, flowable protective material 116 may be dispensed to at least substantially fill the trenches 108, extend over a portion of the active surface 104 of the semiconductor wafer 100, and at least substantially fill the spaces defined between adjacent stacks of semiconductor dice 112 (e.g., the protective material 116 may fill the streets 106 and encapsulate sides of the stacks of semiconductor dice 112). The protective material may optionally also extend over the stacks of semiconductor dice 112.

The protective material 116 may be, for example, a curable polymer, which may be dispensed into position in a flowable state and then cured, using a wafer level molding process. More specifically, the protective material 116 may be a dielectric encapsulant material. As specific, nonlimiting examples, the protective material 116 may be liquid compound R4502-H1 or R4502-A1, available from Nagase ChemteX Corp. of Osaka, Japan; granular compound X89279, available from Sumitomo Corp. of Tokyo, Japan; powder compound GE-100-PWL2-implc from Hitachi Chemical Co., Ltd. of Tokyo, Japan; granular compound XKE G7176, available from Kyocera Chemical Corp. of Kawaguchi, Japan; or sheet compound SINR DF5770M9 or SMC-851 from Shin-Etsu Chemical Co. of Tokyo, Japan.

Figure 5:
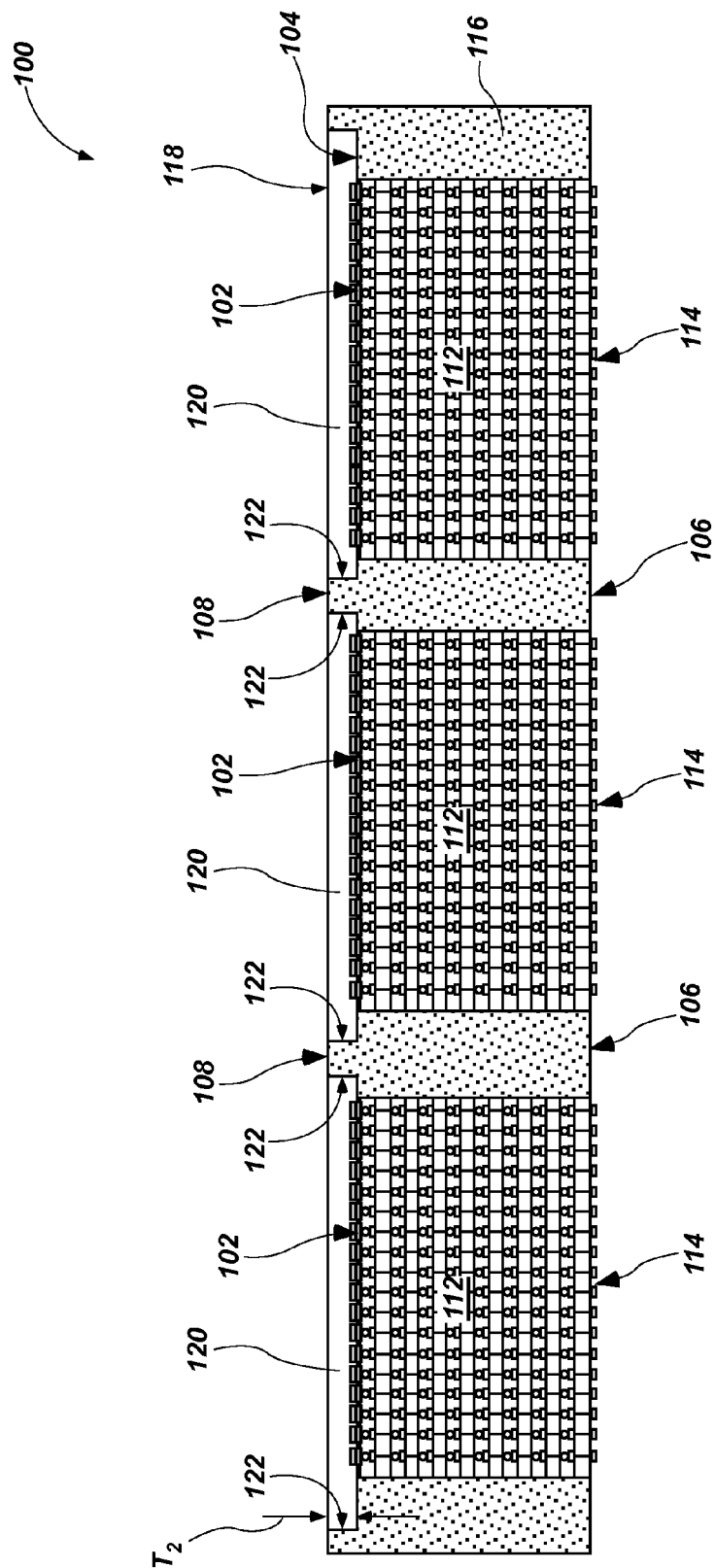
FIG. 5 is a cross-sectional view of the portion of the semiconductor wafer of FIG. 1 in a fifth state.

FIG. 5 is a cross-sectional view of the portion of the semiconductor wafer 100 of FIG. 1 in a fifth state. The thickness $T_1$ (see FIG. 2) of the semiconductor wafer 100 may be reduced from a back side 118 of the wafer 100 opposing the active surface 104. More specifically, the thickness $T_1$ (see FIG. 2) of the semiconductor wafer 100 may be reduced from the back side 118 to a predetermined final thickness $T_2$ of the semiconductor wafer 100 by, for example, grinding semiconductor material from the semiconductor wafer 100 to remove the majority of the thickness of semiconductor material from wafer 100, followed by an abrasive planarization process, such as a chemical mechanical planarization (CMP) process, to remove additional semiconductor material and, in some embodiments, expose ends of conductive vias (commonly termed "through silicon" vias) extending partially through the thickness $T_1$ of wafer 100. Such thinning of the semiconductor wafer 100 to the predetermined final thickness $T_2$ may be used to expose the protective material 116 at the bottoms of the trenches 108 at the back side 118 of wafer 100, leaving the semiconductor wafer 100 in the form of base semiconductor dice 120, and corresponding stacks of semiconductor dice 112, connected solely by protective material 116.

Consequently, semiconductor wafer 100 in such a state may comprise a structure of discontinuous semiconductor material of the individual base semiconductor dice 120 separated by the trenches 108 and the protective material 116 within the trenches 108. Protective material 116 within the trenches 108 may be located on side surfaces 122 of the semiconductor dice 120 obtained from the semiconductor wafer 100. For example, the protective material 116 may extend from the active surface 104 of a base semiconductor die 120 obtained from the semiconductor wafer 100, past edges defined by intersections between the active surface 104 and the side surfaces 122 of the base semiconductor die 120, and along the side surfaces 122 of the base semiconductor die 120 to back side 118 of wafer 100, which is now substantially coincident with a back side 118 of each base semiconductor die 120. An exposed surface of the protective material 116 may be at least substantially coplanar with the back side 118 of each base semiconductor die 120.

Figure 6:
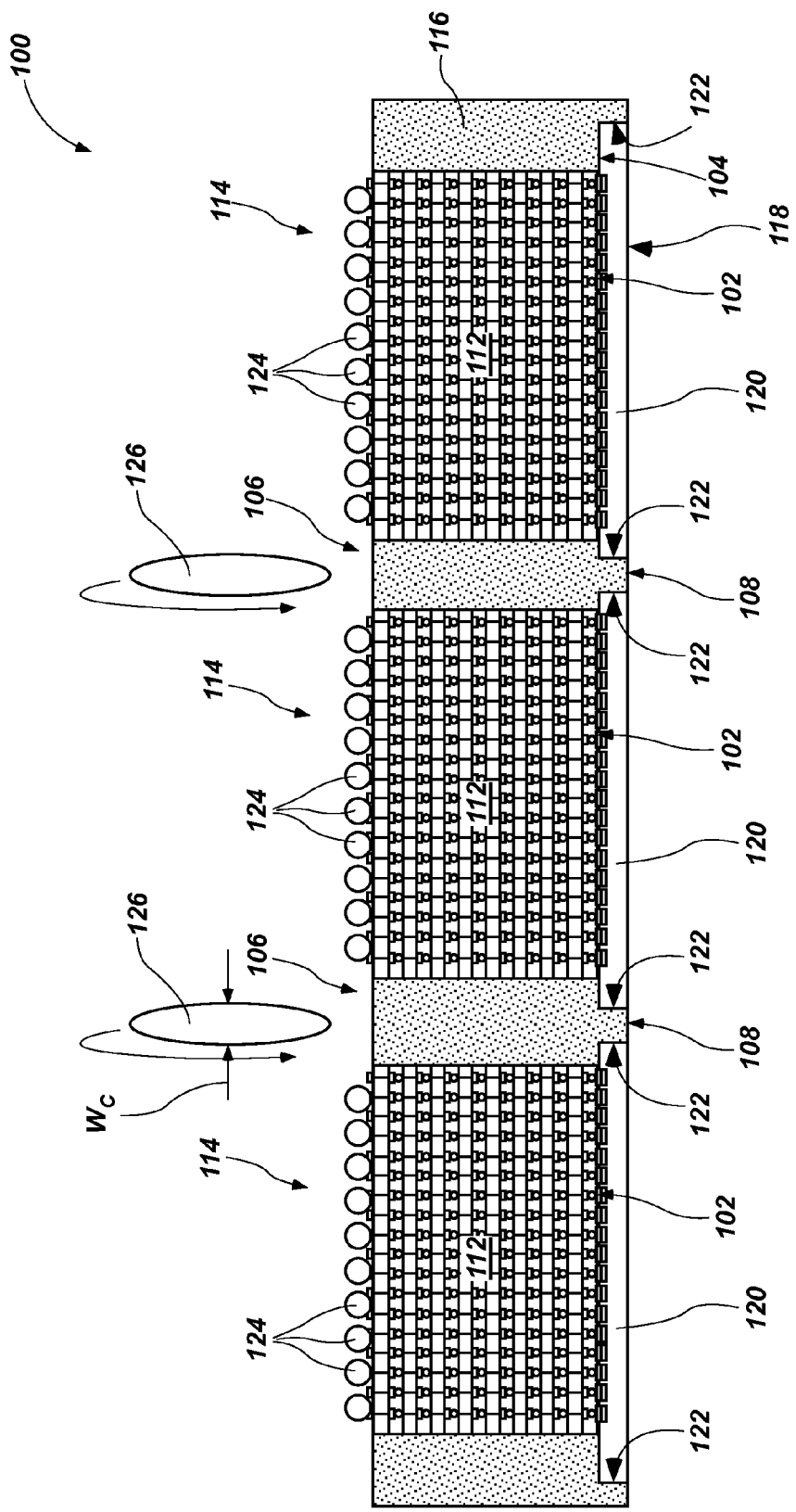
FIG. 6 is a cross-sectional view of the portion of the semiconductor wafer of FIG. 1 in a sixth state.

FIG. 6 is a cross-sectional view of the portion of the semiconductor wafer 100 of FIG. 1 in a sixth state. Electrically conductive elements 124 (e.g., conductive bumps, conductive balls, conductive pillars, solder balls, etc.) may be physically and electrically connected to each semiconductor device 114 in a wafer level process. For example, the electrically conductive elements 124 may be physically and electrically connected to bond pads, which may comprise at least some redistributed bond pads, on a die of the stack of semiconductor dice 112 most distant from the base semiconductor die 120 obtained from the semiconductor wafer 100. As another example, the electrically conductive elements 124 may be physically and electrically connected to bond pads on the back side 118 of the base semiconductor die 120 obtained from the semiconductor wafer 100, if base semiconductor die 120 includes conductive vias extending to back side 118.

The stacked semiconductor dice 112 and base semiconductor dice 120 comprising regions of integrated circuitry 102 and singulated from the semiconductor wafer 100 may be separated from one another to form individual semiconductor devices 114 from the semiconductor wafer 100. For example, a second blade or blades 126 configured to cut through the protective material 116 (e.g., toothed metal saw blades), and different from the first blades 110 (see FIG. 2), may be used to cut entirely through the protective material 116 along the streets 106 and within the trenches 108 to separate the semiconductor devices 114 comprising semiconductor base dice 120 obtained from the semiconductor wafer 100 and corresponding stacks of semiconductor dice 112 from one another. As shown in FIG. 6, the second blades 126 may only cut through protective material 116 while separating the semiconductor devices 114 from one another due to alignment of the cuts made by second blades 126 with streets 106 and trenches 108.

A width $W_C$ of a cut made by the second blades 126 may be less than the width $W_T$ (see FIG. 2) of the trenches 108. For example, the width $W_C$ of the cut made by the second blades 126 may be about nine-tenths of the width $W_T$ (see FIG. 2) of the trenches 108 or less. More specifically, the width $W_C$ of the cut made by the second blades 126 may be, for example, about three-fourths of the width $W_T$ (see FIG. 2) of the trenches 108 or less. As a specific, nonlimiting example, the width $W_C$ of the cuts made by the second blades 126 may be about one-half of the width $W_T$ (see FIG. 2) of the trenches 108 or less. Thus, after cutting by second blade or blades 126, protective material 116 may remain on the side surfaces 122 of the semiconductor dice 120 obtained from the semiconductor wafer 100. In other words, due to the difference in width $W_T$ of trenches 108 separating the stacked semiconductor dice 112 and corresponding base semiconductor dice 120 obtained from the semiconductor wafer 100 from one another and the width $W_C$ of the cuts made by second blades 126, the cuts made by second blades 126 do not remove all the protective material 116 from the side surfaces 122 of any base semiconductor die 120 flanking the cuts. Some protective material 116 between adjacent semiconductor dice 120 obtained from the semiconductor wafer 100 may be removed, but a thickness of protective material 116 sufficient to cover and protect side surfaces 122 of base semiconductor dice 120 remains.

In embodiments of the disclosure, a method comprises cutting partially through a thickness of a semiconductor wafer to form trenches between stacks of semiconductor dice on regions of integrated circuitry of the semiconductor wafer, dispensing a protective material into the trenches and to a level at least substantially the same as a height of the stacks of semiconductor dice, removing material of the semiconductor wafer from a back side thereof at least to a depth sufficient to expose the protective material in the trenches, and cutting through the protective material between the stacks of semiconductor dice at least to a level of the exposed protective material within the trenches.

Figure 7:
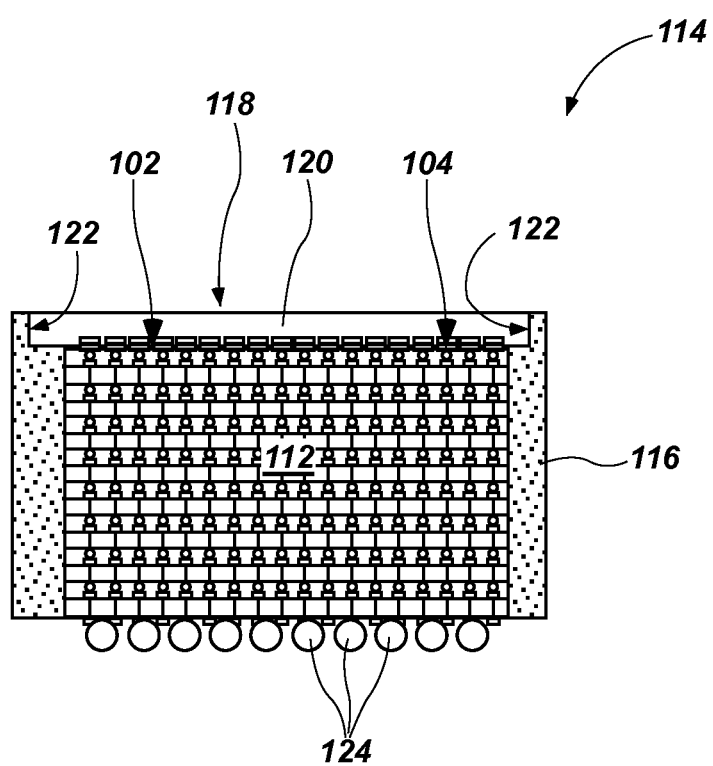
FIG. 7 is a cross-sectional view of a semiconductor device from the portion of the semiconductor wafer of FIG. 1.

FIG. 7 is a cross-sectional view of a semiconductor device 114 singulated from the portion of the semiconductor wafer 100 of FIG. 1. The semiconductor device 114 may include a base semiconductor die 120 obtained from the semiconductor wafer 100. A back side 118 of the base semiconductor die 120 may be exposed (e.g., uncovered). The back side 118 may be, for example, the only exposed surface of the base semiconductor die 120. Side surfaces 122 of the base semiconductor die 120 may be covered by a protective material 116 located on (e.g., adhered to) the side surfaces 122. An entire area of each side surface 122 may be covered by the protective material 116, from an intersection with an active surface 104 of semiconductor die 120 to an intersection with the back side 118. An exposed edge surface of the protective material 116 may be coplanar with the back side 118. The protective material 116 may further extend over at least a portion of the active surface 104 of the semiconductor die 120 extending peripherally inwardly over the active surface 104 to the stack of semiconductor dice 112. Thus, the sides of the stack of semiconductor dice 112 and the surface of base semiconductor die 120 facing the stack, as well as side surfaces 122 of base semiconductor die 120 are covered with a common, continuous protective material 116. The completed semiconductor device 114 incorporating electrically conductive elements 124 may be employed without an interposer or additional overmolding of protective material.

Embodiments of the disclosure include a semiconductor device comprising a stack of semiconductor dice on a base semiconductor die of greater lateral extent than the semiconductor dice in the stack and a common, continuous protective material adjacent sides of the semiconductor dice in the stack, a surface of the base semiconductor die facing and surrounding the stack of semiconductor dice, and side surfaces of the base semiconductor die.

In some embodiments and as noted above, a stack of semiconductor dice 112 may be located on, physically secured to, and electrically connected to a region of integrated circuitry 102 on the active surface 104 of the semiconductor die 120. A footprint of each semiconductor die 112 in the stack of semiconductor dice 112 may be, for example, less than a footprint of the semiconductor die 120 obtained from the semiconductor wafer 100. More specifically, a surface area in a major plane of each semiconductor die 112 in the stack of semiconductor dice 112 may be, for example, less than the surface area of a major plane of a base semiconductor die 120 from the semiconductor wafer 100. Thus, an outer periphery of the stack of semiconductor dice 122 is laterally inset from an outer periphery of base semiconductor die 120.

Figure 8:
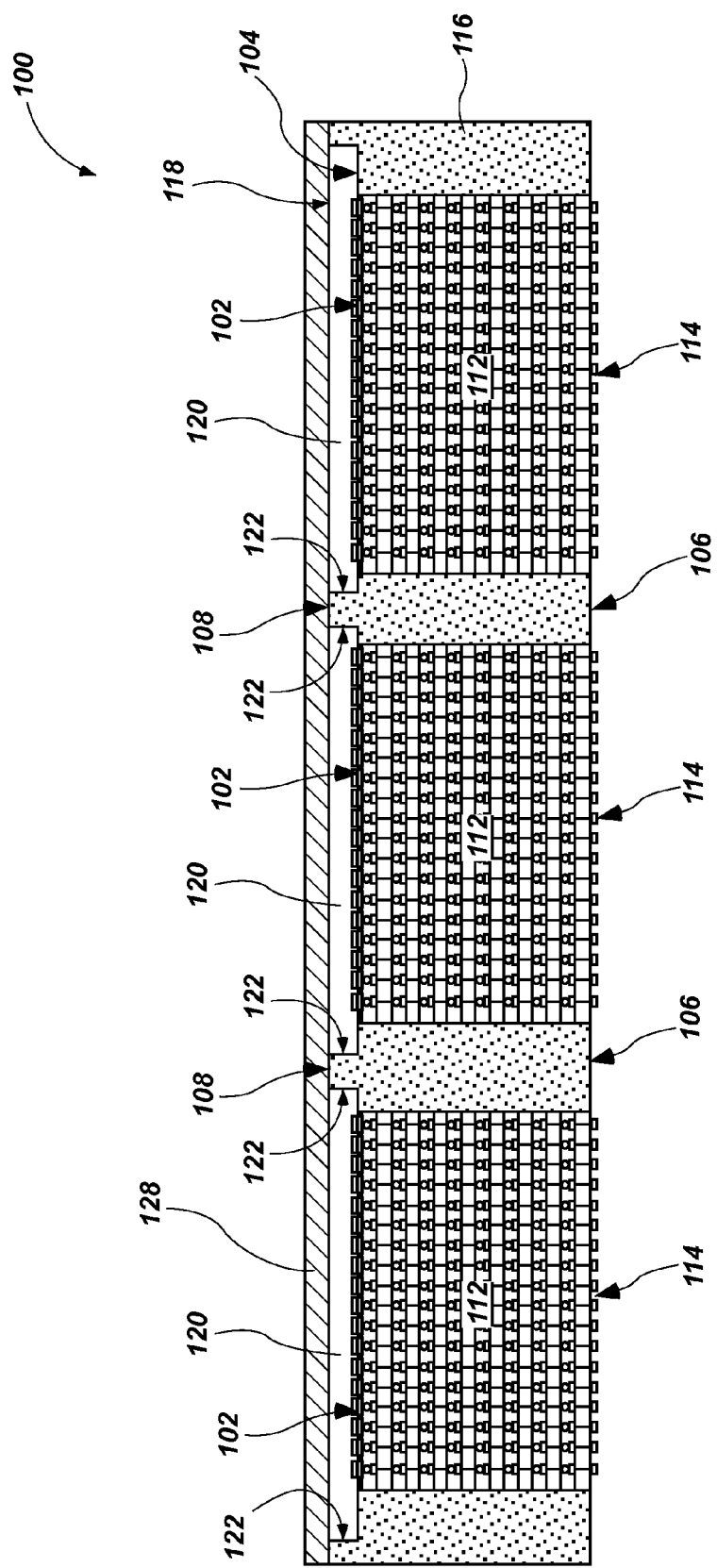
FIG. 8 is a cross-sectional view of the portion of the semiconductor wafer of FIG. 1 in a seventh state.

FIG. 8 is a cross-sectional view of the portion of the semiconductor wafer of FIG. 1 in a seventh state. In some embodiments, such as that shown in FIG. 8, an optional protective film 128 may be positioned on the back side 118 of the semiconductor wafer 100 after thinning the semiconductor wafer 100 and before separating the semiconductor devices 114 obtained from the semiconductor wafer 100 from one another. The protective film 128 may cover the back sides 118 of each base semiconductor die 120 obtained from the wafer 100. Each of the active surface 104, the side surfaces 122, and the back side 118 of the semiconductor die 120 may be protected such that none of the active surface 104, the side surfaces 122, and the backside 118 are exposed.

The protective film 128 may be, for example, a film of polymer material adhered to the backside 118 of the semiconductor wafer 100. More specifically, the protective film 128 may be, for example, a back side coating tape. As a specific, nonlimiting example, the protective film 128 may be Adwill LC2850/2841/2824H back side coating tape available from Lintec Corp. of Tokyo Japan. In some embodiments, information relating to the semiconductor device 114 and processing of the semiconductor device 114 (e.g., the manufacturer, device type, components and use, batch number, device number, etc.) may be placed on the protective film 128, such as, for example, by laser engraving the information onto the protective film 128.

Figure 9:
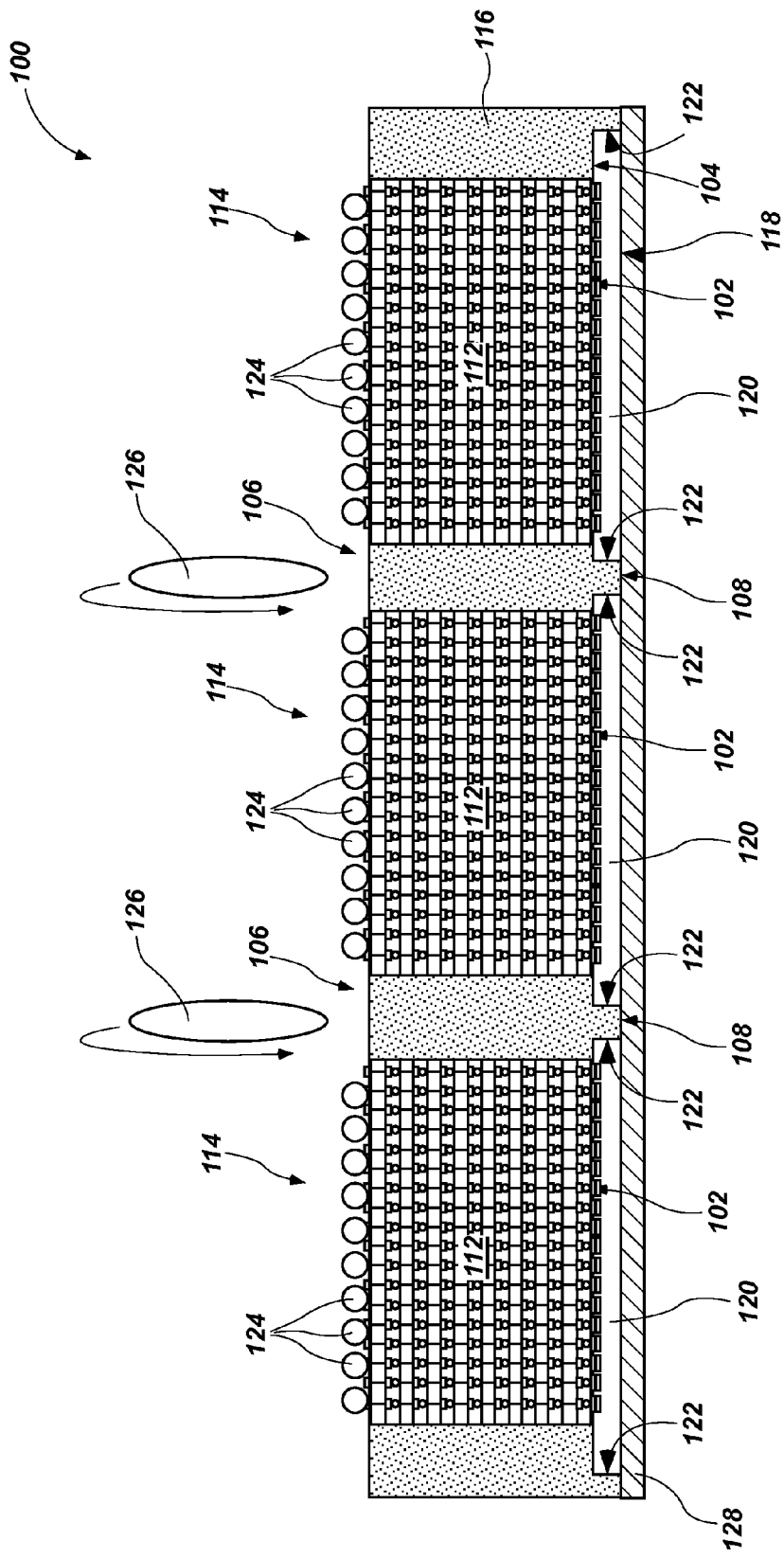
FIG. 9 is a cross-sectional view of the portion of the semiconductor wafer of FIG. 1 in an eighth state.

FIG. 9 is a cross-sectional view of the portion of the semiconductor wafer 100 of FIG. 1 in an eighth state. Electrically conductive elements 124 may be physically and electrically connected to each semiconductor device 114, as described previously in connection with FIG. 6. The semiconductor devices 114 comprising stacked semiconductor dice 112 and base semiconductor dice 120 obtained from the semiconductor wafer 100 may be separated from one another to form individual semiconductor devices 114 from the semiconductor wafer 100. For example, the second blades 126 configured to cut through the protective material 116 may cut entirely through the protective material 116 and the protective film 128 along the streets 106 and within the trenches 108 to separate the semiconductor devices 114 from one another.

Figure 10:
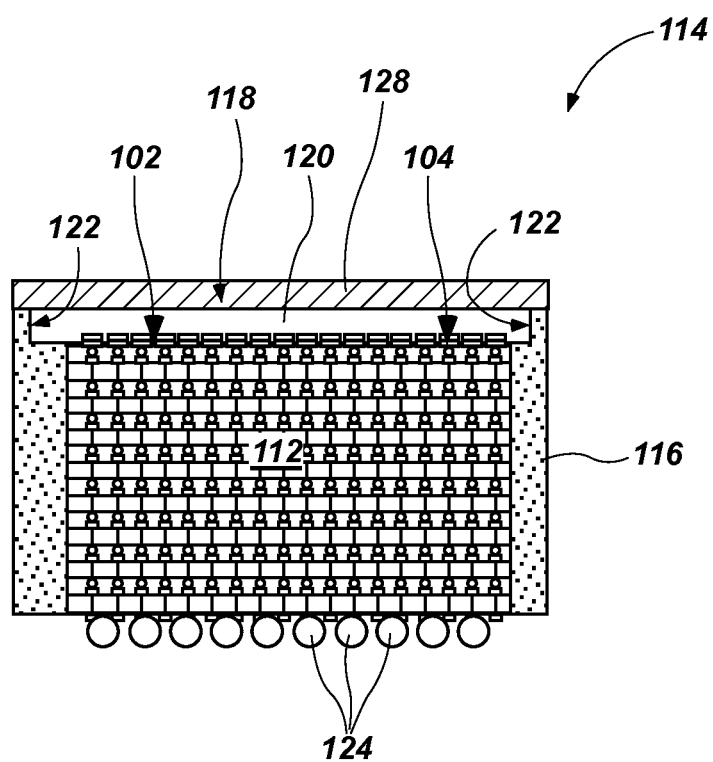
FIG. 10 is a cross-sectional view of another embodiment of a semiconductor device from the portion of the semiconductor wafer of FIG. 1.

FIG. 10 is a cross-sectional view of another embodiment of a semiconductor device 114. The semiconductor device 114 may include a base semiconductor die 120 obtained from the semiconductor wafer 100. A back side 118 of the base semiconductor die 120 may be covered by the protective film 128. Side surfaces 122 of the base semiconductor die 120 may be covered by the protective material 116 located on (e.g., adhered to) the side surfaces 122. An entire surface area of each side surface 122 may be covered by the protective material 116, from an intersection with an active surface 104 to an intersection with the back side 118. A surface of the protective material 116 substantially coplanar with the backside 118 may contact (e.g., may be adhered to) a face of the protective film 128 substantially coplanar with back side 118. The protective material 116 may further extend over at least a portion of the active surface 104 of the semiconductor die 120. None of the surfaces of the semiconductor die 120, including the back side 118, the side surfaces 122, and the active surface 104 may be exposed. The completed semiconductor device 114 functions without an interposer.

Thus, it is apparent that embodiments of the disclosure may be implemented to reduce (e.g., prevent) mechanical chipping of the base semiconductor dice of the semiconductor devices described herein, to reduce (e.g., prevent) delamination of a protective material from between a surface the base semiconductor die and the protective material covering the die stack, and to improve assembly yield and package reliability. In addition, the need for an interposer is eliminated, as is an additional overmolding of a protective material on the assembly. The foregoing may be implemented with minimal impact to die design and with minimal additional cost utilizing current manufacturing capability.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be implemented and encompassed within the scope of this disclosure and as claimed, including legal equivalents. In addition, features from one disclosed embodiment may be combined with features of another disclosed embodiment while remaining within the scope of this disclosure.

What is claimed is:

1. A method, comprising:

forming trenches of a first width in streets between regions of a semiconductor wafer, each region sized and configured to bear a corresponding stack of semiconductor dice positioning a stack of semiconductor dice on a surface of each region after forming the trenches in the streets, leaving a peripheral portion of the surface of each region exposed;

positioning a protective material only between the stacks of semiconductor dice, over the exposed peripheral portions of the regions, and in the trenches to leave bond pads located on the semiconductor die farthest from the semiconductor die of the stack proximate the semiconductor wafer exposed;

reducing a thickness of the semiconductor wafer from a back side of the semiconductor wafer to a final thickness to expose the protective material in the trenches at the back side surface of the semiconductor wafer;

connecting electrically conductive elements to at least some of the exposed bond pads located on a semiconductor die farthest from a semiconductor die of each stack proximate the semiconductor wafer; and cutting between the regions of the semiconductor wafer and corresponding stacks of semiconductor dice by making cuts of a second, narrower width from the semiconductor dice of the stacks farthest from the semiconductor wafer completely through the protective material between the stacks of semiconductor devices and within the trenches, leaving the protective material on sides of the semiconductor dice of the die stacks and on side surfaces of the regions within the trenches; and leaving the electrically conductive elements connected to the bond pads located on the semiconductor die farthest from the semiconductor die of the stack proximate the semiconductor wafer exposed for forming electrical connections between the stack of semiconductor dice to another device or structure.

2. The method of claim 1, wherein forming the trenches comprises forming the trenches to a depth greater than or equal to the final thickness of the semiconductor wafer.

3. The method of claim 2, wherein forming the trenches to the depth greater than or equal to the final thickness of the semiconductor wafer comprises forming the trenches to a depth greater than or equal to 40 microns.

4. The method of claim 1, wherein forming the trenches comprises cutting partially through a thickness of the semiconductor wafer using a first blade configured to cut through material of the semiconductor wafer and cutting between the wafer regions and corresponding stacks of semiconductor dice comprises cutting completely through the protective material within the trenches using a second, different blade configured to cut through the protective material.

5. The method of claim 1, wherein cutting between the wafer regions and stacks of semiconductor dice from one another comprises cutting through the protective material without cutting through material of the semiconductor wafer.

6. The method of claim 1, wherein forming the trenches of the first width comprises forming the trenches to a first width between about one-tenth and about nine-tenths a third width of the streets.

7. The method of claim 6, wherein forming the trenches to the first width between about one-tenth and about nine-tenths the third width of the streets comprises forming the trenches to a width between about 100 microns and about 200 microns.

8. The method of claim 1, wherein positioning the protective material in the trenches comprises dispensing a flowable encapsulant material in the trenches and curing the encapsulant material.

9. The method of claim 1, further comprising positioning a protective film over a backside of the semiconductor wafer before separating the wafer regions and corresponding stacks of semiconductor dice.

10. The method of claim 9, wherein cutting through the wafer regions and corresponding stacks of semiconductor dice comprises cutting through the protective material and the protective film without cutting through material of the semiconductor wafer.

11. The method of claim 1, wherein positioning the protective material between the stacks of semiconductor dice and in the trenches comprises positioning the protective material to one of a level substantially coincident with a height of the stacks of semiconductor dice and a level sufficient to extend over uppermost dice in the stacks of semiconductor dice.

* * * * *

UNITED STATES PATENT AND TRADEMARK OFFICE
CERTIFICATE OF CORRECTION

PATENT NO.         : 9,786,643 B2
APPLICATION NO.    : 14/325619
DATED              : October 10, 2017
INVENTOR(S)        : Zhaohui Ma et al.

Page 1 of 1

It is certified that error appears in the above-identified patent and that said Letters Patent is hereby corrected as shown below:

In the Specification
Column 3,   Line 19,   change "may be faulted in" to --may be formed in--
Column 5,   Line 13,   change "GE-100-PWL2-implc" to --GE-100-PWL2-imp1c--

Signed and Sealed this
Second Day of January, 2018

Joseph Matal
*Performing the Functions and Duties of the
Under Secretary of Commerce for Intellectual Property and
Director of the United States Patent and Trademark Office*